US012751186B2

(12) United States Patent
Ou

(10) Patent No.: US 12,751,186 B2
(45) Date of Patent: Sep. 29, 2026

(54) DISPLAY PANEL

(71) Applicant: GUANGZHOU CHINA STAR OPTOELECTRONICS SEMICONDUCTOR DISPLAY TECHNOLOGY CO., LTD., Guangzhou (CN)

(72) Inventor: Jianbing Ou, Guangzhou (CN)

(73) Assignee: GUANGZHOU CHINA STAR OPTOELECTRONICS SEMICONDUCTOR DISPLAY TECHNOLOGY CO., LTD., Guangzhou (CN)

( * ) Notice: Subject to any disclaimer, the term of this patent is extended or adjusted under 35 U.S.C. 154(b) by 1174 days.

(21) Appl. No.: 17/756,044

(22) PCT Filed: Apr. 14, 2022

(86) PCT No.: PCT/CN2022/086817

§ 371 (c)(1),
(2) Date: Sep. 28, 2023

(87) PCT Pub. No.: WO2023/178758

PCT Pub. Date: Sep. 28, 2023

(65) Prior Publication Data

US 2024/0164190 A1 May 16, 2024

(30) Foreign Application Priority Data

Mar. 24, 2022 (CN) ......................... 202210297151.2

(51) Int. Cl.
*H10K 59/80* (2023.01)
*H10K 102/00* (2023.01)

(52) U.S. Cl.
CPC ........... *H10K 59/879* (2023.02); *H10K 59/87* (2023.02); *H10K 2102/351* (2023.02)

(58) Field of Classification Search
CPC ......................... H10K 59/18; H10K 2102/351
(Continued)

(56) References Cited

U.S. PATENT DOCUMENTS 10,454,051 B2 * 10/2019 Heo ..................... H10K 59/875
2010/0238648 A1 * 9/2010 Tsukahara ......... G02F 1/133603 362/231
(Continued)

FOREIGN PATENT DOCUMENTS

CN 106298834 A 1/2017
CN 108666441 A 10/2018
(Continued)

OTHER PUBLICATIONS

Chinese Office Action issued in corresponding Chinese Patent Application No. 202210297151.2 dated Jun. 27, 2025, pp. 1-10.
(Continued)

*Primary Examiner* — Christopher M Raabe
(74) *Attorney, Agent, or Firm* — PV IP PC; Christopher S. Ruprecht; Wei Te Chung

(57) ABSTRACT

The present application discloses a display panel. The display panel includes a light-emitting layer and an adjustment layer. The light-emitting layer includes multiple light-emitting unit groups arranged along a first direction. Each light-emitting unit group includes at least one light-emitting unit. The multiple light-emitting unit groups includes one visual center unit group. Multiple adjustment unit groups have multiple thicknesses, and heights of the light-emitting unit groups located on the two sides of the visual center unit group are smaller than a height of the visual center unit group.

15 Claims, 5 Drawing Sheets

(58) Field of Classification Search
USPC .................................................. 313/498–512
See application file for complete search history.

(56) References Cited

U.S. PATENT DOCUMENTS

| | | | | |
|---|---|---|---|---|
| 2012/0168778 | A1 | 7/2012 | Kim | |
| 2015/0153581 | A1 | 6/2015 | Wang | |
| 2016/0226013 | A1 | 8/2016 | Liu et al. | |
| 2021/0065588 | A1* | 3/2021 | Zhang | H10K 59/1213 |
| 2021/0208715 | A1* | 7/2021 | Yang | G06F 3/0444 |
| 2024/0373725 | A1* | 11/2024 | Sun | H10K 59/38 |

FOREIGN PATENT DOCUMENTS

| | | | |
|---|---|---|---|
| CN | 108987450 | A | 12/2018 |
| CN | 109004013 | A | 12/2018 |
| CN | 110164952 | A | 8/2019 |
| CN | 110323262 | A | 10/2019 |
| CN | 110379934 | A | 10/2019 |
| CN | 110649076 | A | 1/2020 |
| CN | 111682126 | A | 9/2020 |
| CN | 112420960 | A | 2/2021 |
| CN | 113471386 | A | 10/2021 |
| JP | 2000174385 | A | 6/2000 |
| JP | 2019133816 | A | 8/2019 |
| WO | 2019205468 | A1 | 10/2019 |

OTHER PUBLICATIONS

International Search Report in International application No. PCT/CN2022/086817, mailed on Nov. 30, 2022.

Written Opinion of the International Search Authority in International application No. PCT/CN2022/086817,mailed on Nov. 30, 2022.

* cited by examiner

DISPLAY PANEL

FIELD OF THE ART

The present application relates to a field of display technology, and more specifically to a display panel.

BACKGROUND OF THE DISCLOSURE

In an organic electroluminescent display panel, a top light-emitting device structure is usually adopted. The structure is a total reflection anode, an organic light-emitting layer and a semi-reflective cathode disposed in an overlapping manner, and the structure makes the light-emitting device structure form a microcavity.

When an observation point of a human eye is determined, for lights emitted by light-emitting devices at different positions, observation angles of the human eye are different. The farther the light-emitting device is from the observation point of the human eye, the larger an included angle between the light observed by the human eye and emitted by the light-emitting device and a normal line of the corresponding light-emitting device is. In the above case, it is easy to cause differences in chromaticity of the multiple light-emitting devices observed at the observation point. That is, there is a color difference when a screen is viewed. This problem is particularly evident in large-sized organic light-emitting semiconductor display panels.

Technical Problem

Embodiments of the present application provide a display panel to solve a technical problem of chromaticity difference caused by viewing the display panel from different angles.

SUMMARY OF THE DISCLOSURE

In order to solve the above-mentioned problems, technical solutions provided by the present application are as follows:

Embodiments of the present application provide a display panel, comprising:

- a light-emitting layer, comprising multiple light-emitting unit groups arranged along a first direction, the light-emitting unit group comprising at least one light-emitting unit, the multiple light-emitting unit groups comprising one visual center unit group, a rest of the multiple light-emitting unit groups being respectively located on two sides of the visual center unit group;
- an adjustment layer, being disposed on one side of a backlight surface of the light-emitting layer, the adjustment layer comprising multiple adjustment unit groups, the adjustment unit groups being disposed corresponding to the light-emitting unit groups;
- wherein, in a direction perpendicular to the light-emitting layer, the multiple adjustment unit groups have multiple thicknesses, and heights of the light-emitting unit groups located on the two sides of the visual center unit group are smaller than a height of the visual center unit group.

In one embodiment, in any two of the adjustment unit groups, a thickness of one adjustment unit group close to the vision center unit group is greater than a thickness of the other adjustment unit group farther from the vision center unit group.

In one embodiment, the display panel comprises an array substrate, the adjustment layer comprises the array substrate.

In one embodiment, the display panel comprises an array substrate, the adjustment layer comprises the array substrate.

In one embodiment, the array substrate comprises a substrate layer, a control device layer disposed on the substrate layer, and a passivation layer disposed on one side of the control device layer away from the substrate layer;

in a direction perpendicular to the light-emitting layer, thicknesses of the substrate layer and the control device layer corresponding to the different adjustment unit groups are same, and the passivation layer corresponding to the different adjustment unit groups has different thicknesses.

In one embodiment, a material of the passivation layer comprises silicon nitride.

In one embodiment, the light-emitting layer comprises: an anode layer, a pixel definition layer disposed on the anode layer, and a cathode layer disposed on the pixel definition layer.

In one embodiment, the pixel definition layer disposes multiple pixel openings, one of the light-emitting units corresponds to one of the pixel openings, and the pixel openings are filled with an organic light-emitting material.

In one embodiment, the anode layer of the light-emitting layer is disposed on the adjustment layer.

The present application further provides a display panel, comprising:

- a light-emitting layer, comprising multiple light-emitting unit groups arranged along a first direction, the light-emitting unit group comprising at least one light-emitting unit, the multiple light-emitting unit groups comprising one visual center unit group, a rest of the multiple light-emitting unit groups being respectively located on two sides of the visual center unit group;
- an adjustment layer, being disposed on one side of a backlight surface of the light-emitting layer, the adjustment layer comprising multiple adjustment unit groups, the adjustment unit groups being disposed corresponding to the light-emitting unit groups, a side surface of the adjustment unit group in contact with the light-emitting unit group being an inclined surface with an inclination angle to make a light-emitting surface of the light-emitting unit in the light-emitting unit group be deflected by a preset angle;
- wherein, the light-emitting surfaces of the light-emitting units in the light-emitting unit groups located on two sides of the visual center unit group are inclined toward the visual center unit group.

In one embodiment, in any two of the adjustment unit groups, the inclination angle of one adjustment unit group close to the vision center unit group is smaller than the inclination angle of the other adjustment unit group farther from the vision center unit group.

In one embodiment, the display panel comprises an array substrate, the adjustment layer comprises the array substrate.

In one embodiment, the array substrate comprises a substrate layer, a control device layer disposed on the substrate layer, and a passivation layer disposed on one side of the control device layer away from the substrate layer;

- in a direction perpendicular to the light-emitting layer, thicknesses of the substrate layer and the control device layer corresponding to the different adjustment unit groups are same, the passivation layer corresponding to the different adjustment unit groups has multiple passivation unit groups, one side of the different passivation unit groups facing the light emitting unit has different inclination angles.

In one embodiment, a material of the passivation layer comprises silicon nitride.

The present application further provides a display panel, comprising:

a light-emitting layer, comprising multiple light-emitting unit groups arranged along a first direction, the light-emitting unit group comprising at least one light-emitting unit, the multiple light-emitting unit groups comprising one visual center unit group, a rest of the multiple light-emitting unit groups being respectively located on two sides of the visual center unit group;

an adjustment layer, being disposed on one side of a light-emitting surface of the light-emitting layer, the adjustment layer comprising multiple adjustment unit groups, the multiple adjustment unit groups comprising one adjustment center unit group corresponding to the visual center unit group;

wherein, refractive indices of materials of the adjustment unit groups on two sides of the adjustment center unit group are greater than a refractive index of a material of the adjustment center unit group.

In one embodiment, in any two of the adjustment unit groups, the refractive index of the material of one adjustment unit group close to the vision center unit group is smaller than the refractive index of the material of the other adjustment unit group farther from the vision center unit group.

In one embodiment, the materials of the different adjustment unit groups in the adjustment layer are different, and the materials of the adjustment unit groups comprise one or more combinations of magnesium fluoride, silicon dioxide, aluminum oxide, silicon monoxide, titanium dioxide, titanium pentoxide, titanium dioxide, titanium monoxide, hafnium oxide, zirconium oxide, niobium oxide, magnesium oxide, zinc oxide, yttrium oxide, aluminum fluoride and barium fluoride.

In one embodiment, the light-emitting layer comprises: an anode layer, a pixel definition layer disposed on the anode layer, and a cathode layer disposed on the pixel definition layer.

In one embodiment, the pixel definition layer disposes multiple pixel openings, one of the light-emitting units corresponds to one of the pixel openings, the pixel openings are filled with an organic light-emitting material, and the cathode layer covers the pixel openings.

In one embodiment, the adjustment layer is disposed above the cathode layer of the light-emitting layer.

Beneficial Effect

The present application disposes the adjustment layer on one side of the light-emitting layer. The adjustment layer may be disposed on one side of a backlight surface of the light-emitting layer, or may be disposed on one side of a light-emitting surface of the light-emitting layer. When the adjustment layer is disposed on one side of the light-emitting layer close to the substrate, by disposing the different adjustment unit groups to have the different thicknesses, heights of the light-emitting unit groups located on two sides of the visual center unit group are smaller than a height of the visual center unit group, so that an included angle between an emergent light of the light-emitting unit and a normal line of the corresponding light-emitting unit is smaller than that before disposing the adjustment layer, thereby providing an effect of reducing chromaticity difference of an electroluminescent display device due to difference in a viewing angle of the user.

By disposing that the light-emitting surfaces of the light-emitting units in the light-emitting unit groups on two sides of the vision center unit group are inclined toward the vision center unit group, heights of the light-emitting unit groups located on the two sides of the visual center unit group are smaller than a height of the visual center unit group, so that the included angle between the emergent light of the light-emitting unit and the normal line of the corresponding light-emitting unit is smaller than that before disposing the adjustment layer, thereby providing an effect of reducing the chromaticity difference of the electroluminescent display device due to difference in the viewing angle of the user.

When the adjustment layer is disposed on one side of the light-emitting layer away from the substrate, the refractive indices of the materials of the adjustment unit groups located on the two sides of the adjustment center unit group are greater than the refractive index of the material of the adjustment center unit group, so that the included angle between the emergent light of the light-emitting unit and the normal line of the corresponding light-emitting unit is smaller than that before disposing the adjustment layer, thereby achieving an effect of reducing the chromaticity difference between the light-emitting unit groups adjacent to the vision center unit group and the vision center unit group.

The above technical solution can effectively reduce the chromaticity difference of the electroluminescent display device due to difference in the viewing angle of the user, further improve the display effect of the display panel.

DETAILED DESCRIPTION OF PREFERRED EMBODIMENTS

The present application provides a display panel. In order to make purposes, technical solutions and effects of the present application clearer and more explicit, the present application will be further described in detail below with reference to accompanying drawings and examples. It should be understood that specific embodiments described herein are only used to explain the present application, but not to limit the present application.

Embodiments of the present application provide a display panel, and will be separately described in detail below. It should be noted that a description order of the following embodiments is not intended to limit a preferred order of the embodiments.

In an organic electroluminescent display panel, a top light-emitting device structure is usually adopted. The structure is a total reflection anode, an organic light-emitting layer and a semi-reflective cathode disposed in an overlapping manner, and the structure makes the light-emitting device structure form a microcavity.

Figure 1:
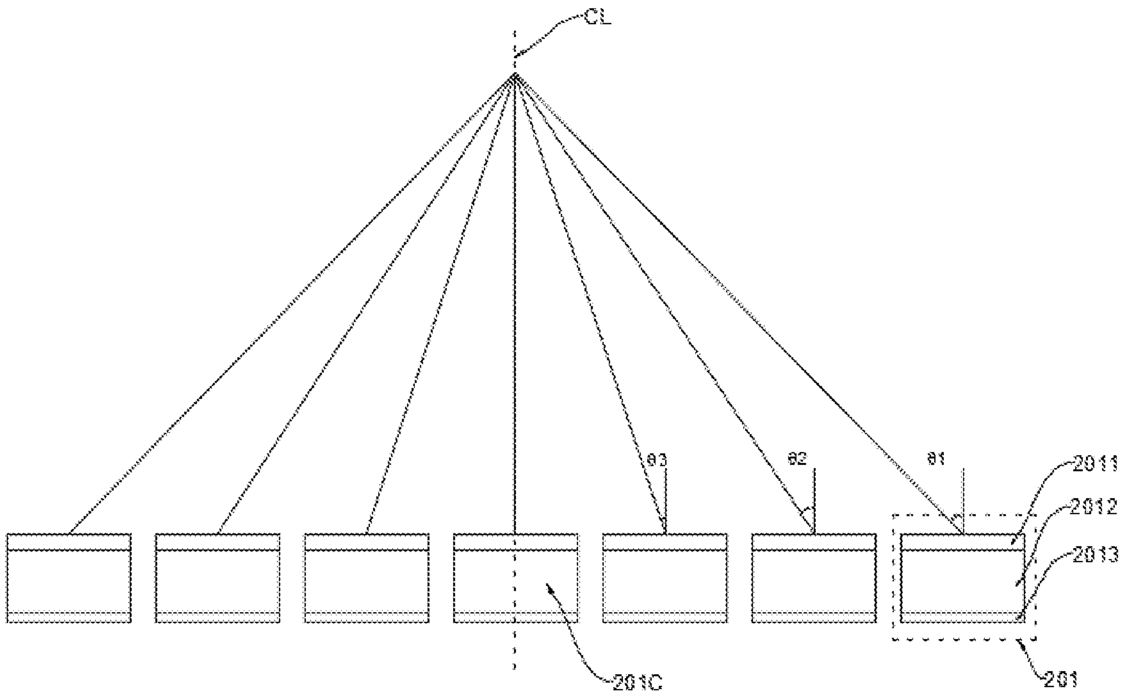
FIG. 1 is a structural schematic diagram of a light-emitting layer of a display panel in the prior art.

As shown in FIG. 1, when an observation point of a human eye is determined, for lights emitted by light-emitting devices at different positions, observation angles of the human eye are different. The farther the light-emitting device is from the observation point of the human eye, the larger an included angle between the light observed by the human eye and emitted by the light-emitting device and a normal line of the corresponding light-emitting device is. That is, $\theta 1>\theta 2>\theta 3$ in FIG. 1. In the above case, it is easy to cause differences in chromaticity of the multiple light-emitting devices observed at the observation point. That is, there is a color difference when a screen is viewed. This problem is particularly evident in large-sized organic light-emitting semiconductor display panels.

In order to solve the above-mentioned technical problems, the present application provides following technical solutions, please refer to the following embodiments for details.

Figure 2:
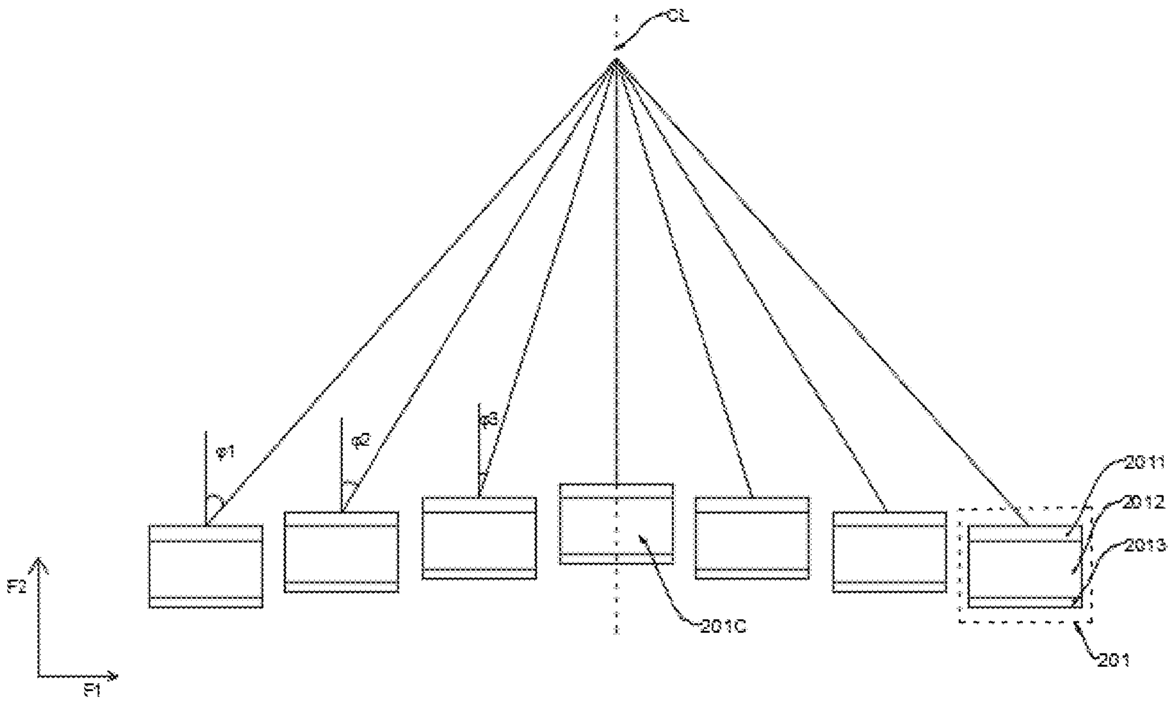
FIG. 2 is a structural schematic diagram of a light-emitting layer of a display panel provided by embodiments of the present application.
Figure 3:
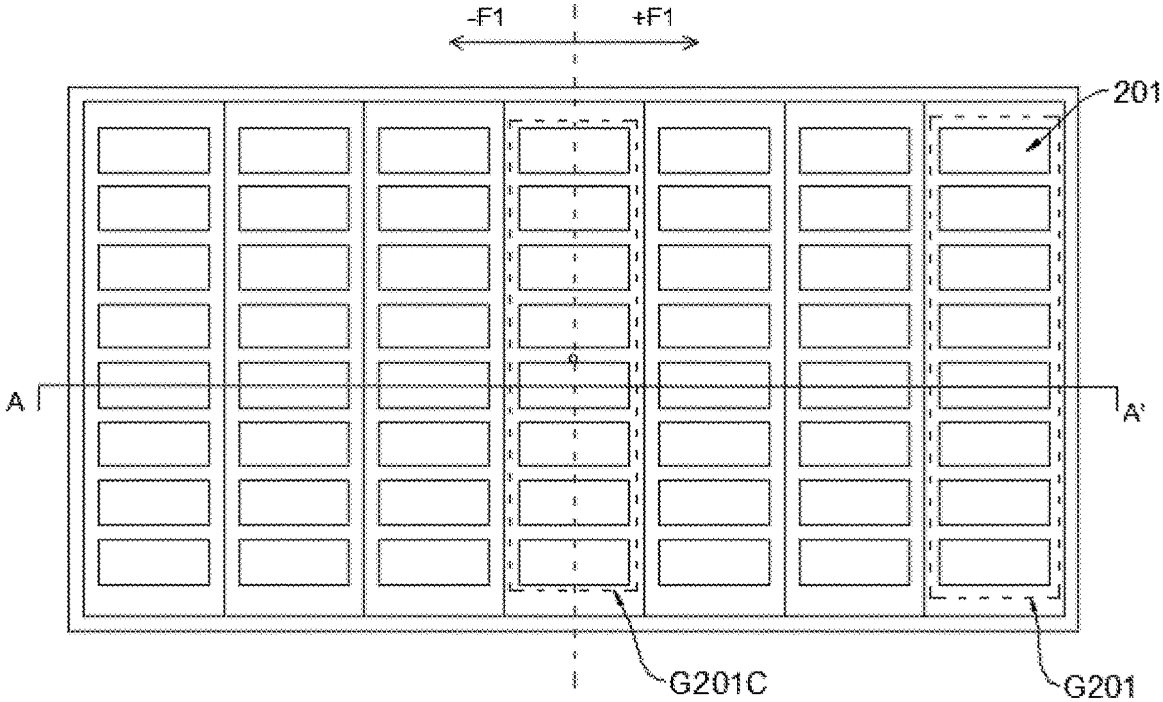
FIG. 3 is a top view of a structure of a display panel provided by the embodiments of the present application.
Figure 4:
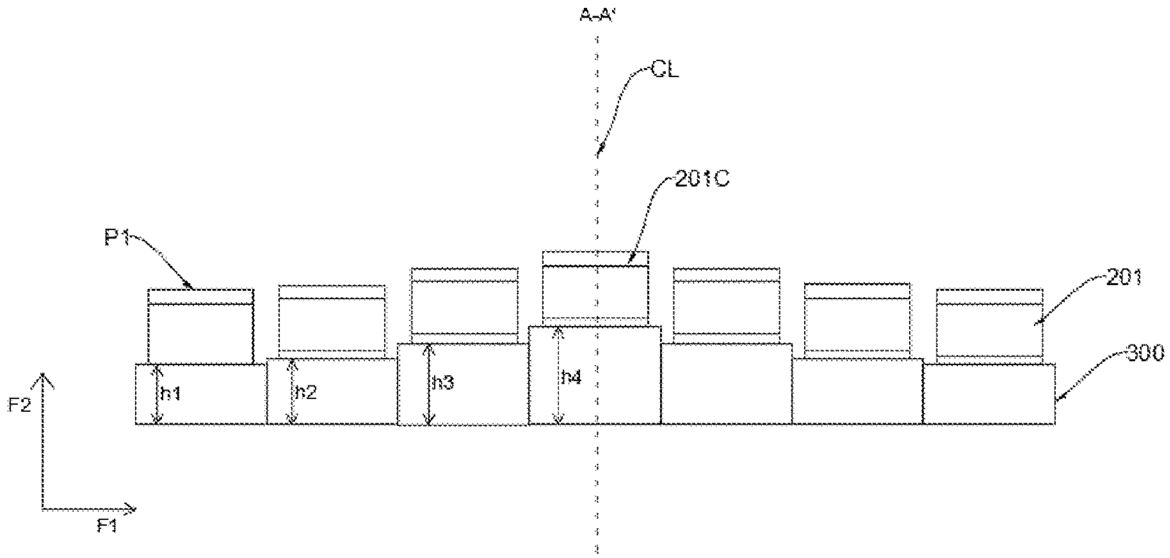
FIG. 4 is a sectional view of a A-A' line in FIG. 3

The embodiments of the present invention provide a display panel, as shown in FIGS. 2, 3 and 4, the display panel comprises:

a light-emitting layer, comprising multiple light-emitting unit groups G201 arranged along a first direction F1, the light-emitting unit group G201 comprising at least one light-emitting unit 201, the multiple light-emitting unit groups G201 comprising one visual center unit group G201C, a rest of the multiple light-emitting unit groups G201 being respectively located on two sides of the visual center unit group G201C;

an adjustment layer 300, being disposed on one side of a backlight surface of the light-emitting layer, the adjustment layer 300 comprising multiple adjustment unit groups, the adjustment unit groups being disposed corresponding to the light-emitting unit groups G201;

wherein, in a direction perpendicular to the light-emitting layer, the multiple adjustment unit groups have multiple thicknesses, and heights of the light-emitting unit groups G201 located on the two sides of the visual center unit group G201C are smaller than a height of the visual center unit group G201C.

Specifically, in the embodiments, the display panel is a rectangular display panel as an example for description. The display panel comprises a long side (a length direction) and a short side (a width direction).

Specifically, a center line CL of the display panel passes through a center of the display panel and is perpendicular to the display panel. The observation point of the human eye may be on the center line CL or not on the center line CL. A second direction F2 is parallel to the center line CL. The first direction F1 and the second direction F2 define a preset included angle.

Specifically, the light-emitting unit group G201 of the display panel vertically corresponding to the observation point of the human eye is the visual center unit group G201C.

Specifically, the visual center unit group G201C comprises multiple visual center units 201C.

It should be noted that the observation point of the human eye is not necessarily located on a plane passing through the center line CL of the display panel and perpendicular to the display panel. Therefore, the visual center unit group G201C determined according to the user's observation point is not limited to the light-emitting unit group G201 at the center of the display panel. But in the embodiments, the description is given by taking as an example that the observation point of the human eye is located on the plane passing through the center line CL of the display panel and perpendicular to the display panel.

Specifically, the display panel comprises an array substrate and a light-emitting layer disposed on the array substrate. The array substrate comprises a substrate layer and a control device layer. The control device layer comprises multiple control devices for controlling the light-emitting units 201 to emit light.

Figure 8:
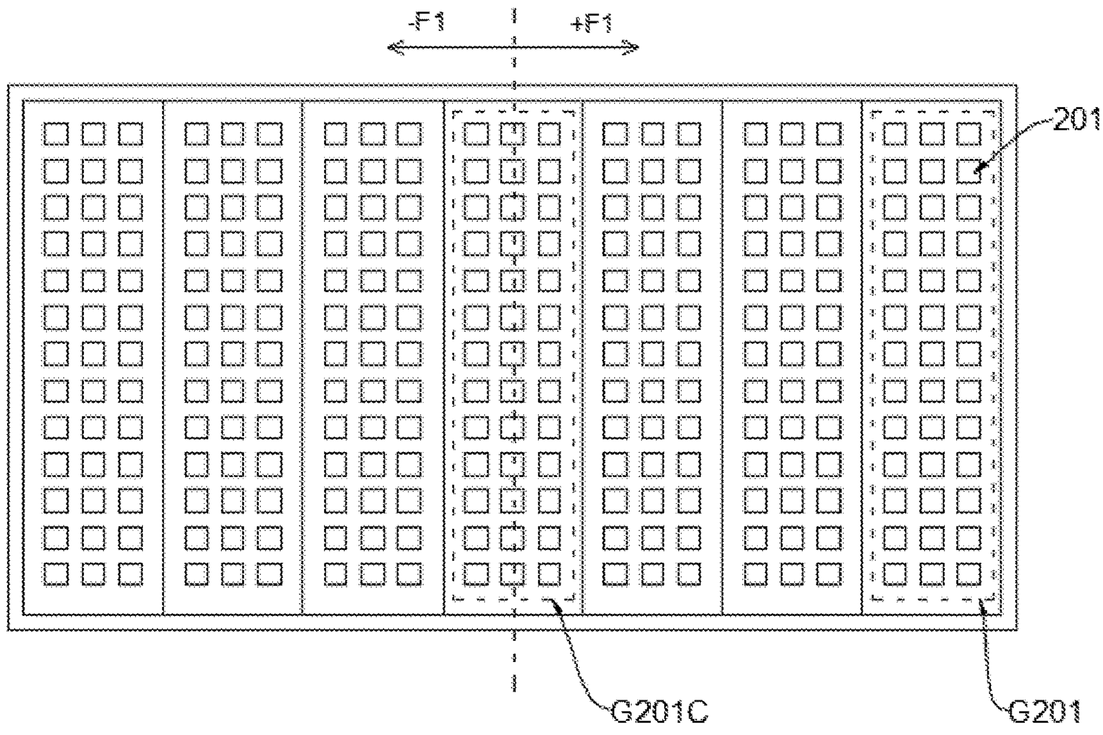
FIG. 8 is a top view of a structure of another display panel provided by the embodiments of the present application.

Specifically, the light-emitting layer comprises multiple light-emitting unit groups G201 arranged along a first direction F1. The light-emitting unit group G201 comprises at least one light-emitting unit 201. In one specific embodiment, as shown in FIGS. 3 and 8, the light-emitting unit group G201 may comprise multiple columns of light-emitting units 201 arranged along a length direction of the display panel. The number of the light-emitting units 201 in each column is the same. The number of columns of the light-emitting units 201 in the different light-emitting unit groups G201 may be the same or may be different (FIG. 8 shows an embodiment with the same number of columns of the light-emitting units 201 in different light-emitting unit groups G201). The number of the light-emitting units 201 in each column in the different light-emitting unit groups G201 is the same. An included angle between the first direction F1 and the second direction F2 may be 90°.

Figure 5:
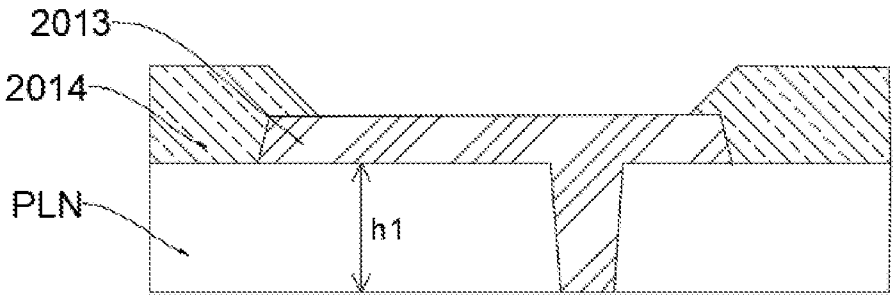
FIG. 5 is a schematic structural diagram of a connection between an adjustment layer and the light-emitting layer provided in the embodiments of the present application.
Figure 6:
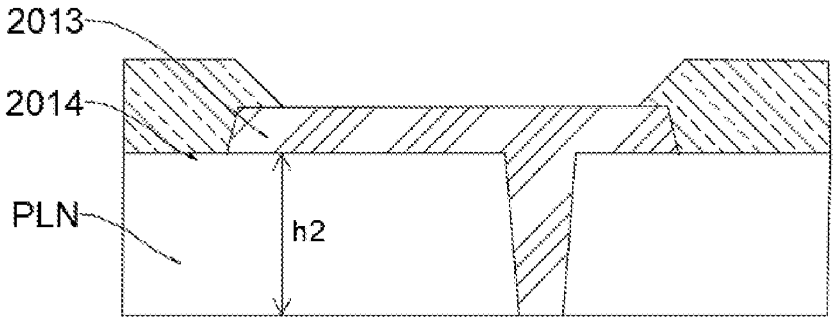
FIG. 6 is a schematic structural diagram of a connection between an adjustment layer and the light-emitting layer provided in the embodiments of the present application.
Figure 7:
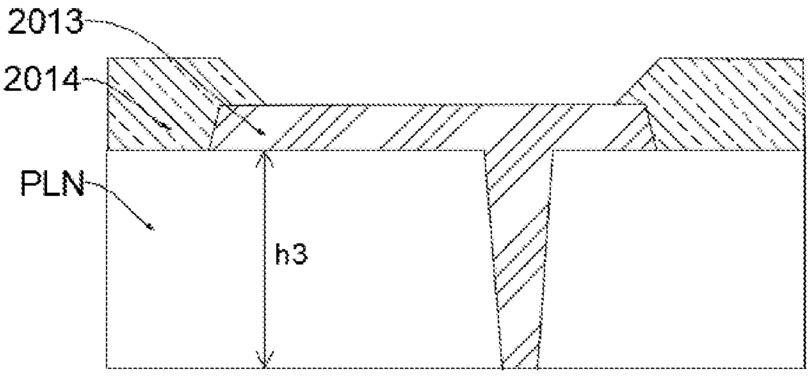
FIG. 7 is a schematic structural diagram of a connection between an adjustment layer and the light-emitting layer provided in the embodiments of the present application.

Specifically, as shown in FIG. 2, FIG. 5, FIG. 6 and FIG. 7, the light-emitting layer comprises: an anode layer 2013, a pixel definition layer 2014 disposed on the anode layer 2013, and a cathode layer 2011 disposed on the pixel definition layer 2014 (not shown in FIG. 5 to FIG. 7). The pixel definition layer 2014 disposes multiple pixel openings. One of the light-emitting units 201 corresponds to one of the pixel openings. The pixel openings are filled with an organic light-emitting material 2012.

Specifically, the anode layer 2013 of the light-emitting layer is in control connection with the control device on the array substrate.

Specifically, the adjustment layer 300 may comprise the array substrate, or may be a film layer separately disposed between the array substrate and the light-emitting layer. Specific material and structure are not limited. That is, a structure of the adjustment layer 300 capable of adjusting a height of the light-emitting unit 201 is within the scope of protection of the present application.

Specifically, the adjustment layer 300 comprises multiple adjustment unit groups. The adjustment unit group comprises multiple adjustment units. The adjustment unit groups and the light-emitting unit groups G201 correspond to each other. The adjustment units in the adjustment unit group and the light-emitting units 201 in the light-emitting unit group G201 correspond to each other.

Specifically, the anode layer 2013 of the light-emitting layer is disposed on the adjustment layer 300, so that the height of the light-emitting unit 201 can be adjusted by a thickness of the adjustment unit.

It can be understood that, when the adjustment layer 300 is disposed on one side of the light-emitting layer close to the substrate, the adjustment unit groups are disposed to have different thicknesses, as shown in FIG. 4, to adjust the heights of the corresponding light-emitting unit groups G201, thereby reducing chromaticity difference between the light-emitting unit groups G201 adjacent to the vision center unit group G201C and the vision center unit group G201C. Namely, an included angle between an emergent light (the emergent light of the light-emitting unit 201 observed by the user) of the light-emitting unit 201 in different light-emitting unit groups G201 and a normal line of the corresponding light-emitting unit 201 is smaller than that before disposing the adjustment layer 300 (ie $\varphi<\theta$) (an angle relationship can be seen by comparing FIG. 1 and FIG. 2). The above technical solution can effectively reduce chromaticity difference of an electroluminescent display device due to difference in a viewing angle of the user, further improve display effect of the display panel and enhance user experience.

In one embodiment, as shown in FIG. 2, in any two of the adjustment unit groups, a thickness of one adjustment unit group close to the vision center unit group G201C is greater than a thickness of the other adjustment unit group farther from the vision center unit group G201C.

Specifically, as shown in FIGS. 2 and 3, the thicknesses of the adjustment unit groups have a gradually decreasing trend in an extending direction (a positive direction (+F1) and a negative direction (−F1) of the first direction F1) from the center line CL to the short side of the display panel.

It can be understood that, by disposing the different adjustment unit groups to have different thicknesses, which have a gradually decreasing trend in the extending direction (the positive direction (+F1) and the negative direction (−F1) of the first direction F1) from the center line CL to the short side of the display panel, chromaticity difference between any two adjacent light-emitting unit groups G201 in the display panel remains stable to improve display uniformity of the display panel.

In one embodiment, the display panel comprises an array substrate. The adjustment layer 300 comprises the array substrate.

Specifically, the array substrate comprises a substrate layer, a control device layer disposed on the substrate layer, and a passivation layer PLN disposed on one side of the control device layer away from the substrate layer. The different adjustment unit groups have different thicknesses. It can be understood that the substrate layer of the array substrate corresponding to the different adjustment unit groups has different thicknesses. It can also be understood that the control device layer of the array substrate corresponding to the different adjustment unit groups has different thicknesses, or that the passivation layer PLN of the array substrate corresponding to the different adjustment unit groups has different thicknesses.

It can be understood that, the array substrate is used as the adjustment layer 300, by adjusting thicknesses of the array substrate to adjust heights of the light emitting units 201 in the light emitting unit groups G201, a thickness of the display panel can be effectively reduced, so that the display panel is lighter and thinner, and a manufacturing process is convenient.

In one embodiment, as shown in FIGS. 5 to 7, the array substrate comprises a substrate layer (not shown), a control device layer (not shown) disposed on the substrate layer, and a passivation layer PLN disposed on one side of the control device layer away from the substrate layer.

In a direction perpendicular to the light-emitting layer, the thicknesses of the substrate layer and the control device layer corresponding to the different adjustment unit groups are the same, and the passivation layer PLN corresponding to the different adjustment unit groups has different thicknesses. By comparing FIGS. 5, 6 and 7, it can be seen that h3>h2>h1.

Specifically, a material of the passivation layer PLN may be silicon nitride.

It can be understood that, the passivation layer PLN on an uppermost layer of the array substrate is disposed with different thicknesses, so that preventing metal traces of the control device layer of the array substrate from breaking due to height difference between layers, which will affect the normal display of the display panel. The passivation layer PLN on the uppermost layer is disposed with the different thicknesses corresponding to the adjustment unit groups, on one hand, it can achieve an effect of isolating the control device and the light-emitting unit 201, and on the other hand, it can also solve a problem of chromaticity difference between the adjacent light-emitting unit groups G201.

Figure 9:
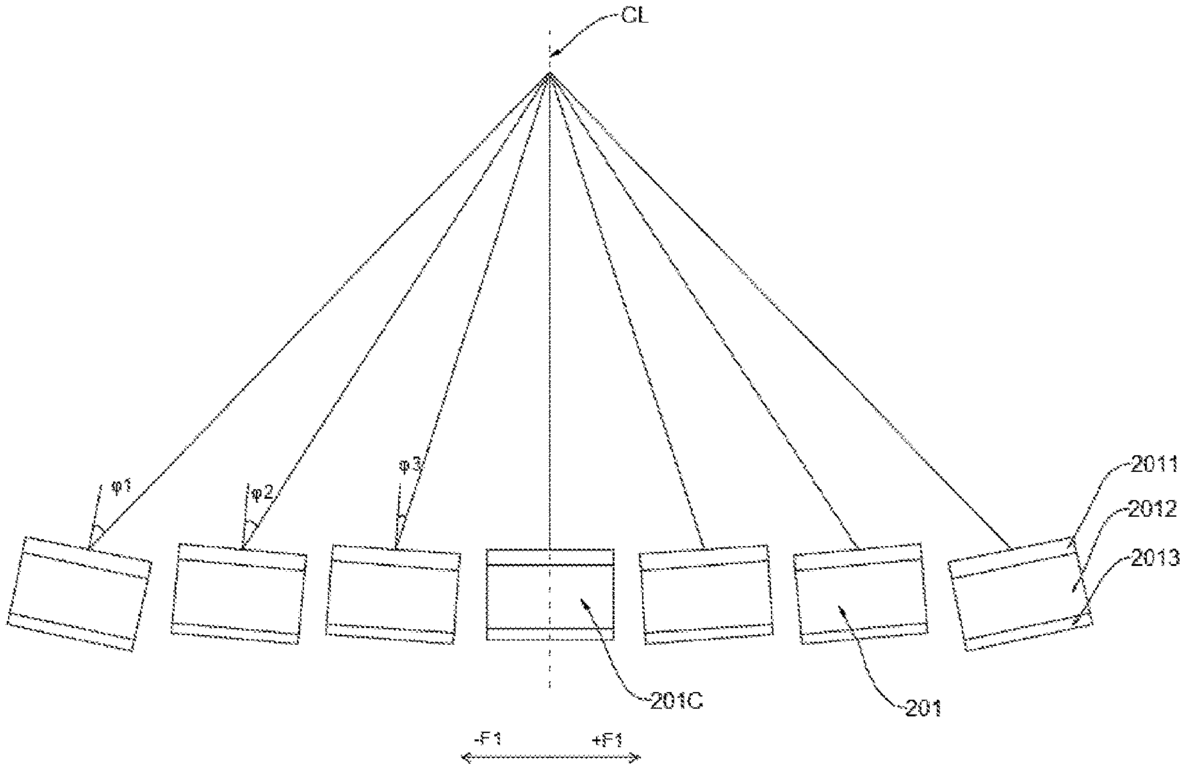
FIG. 9 is a structural schematic diagram of a light-emitting layer of another display panel provided by the embodiments of the present application.
Figure 10:
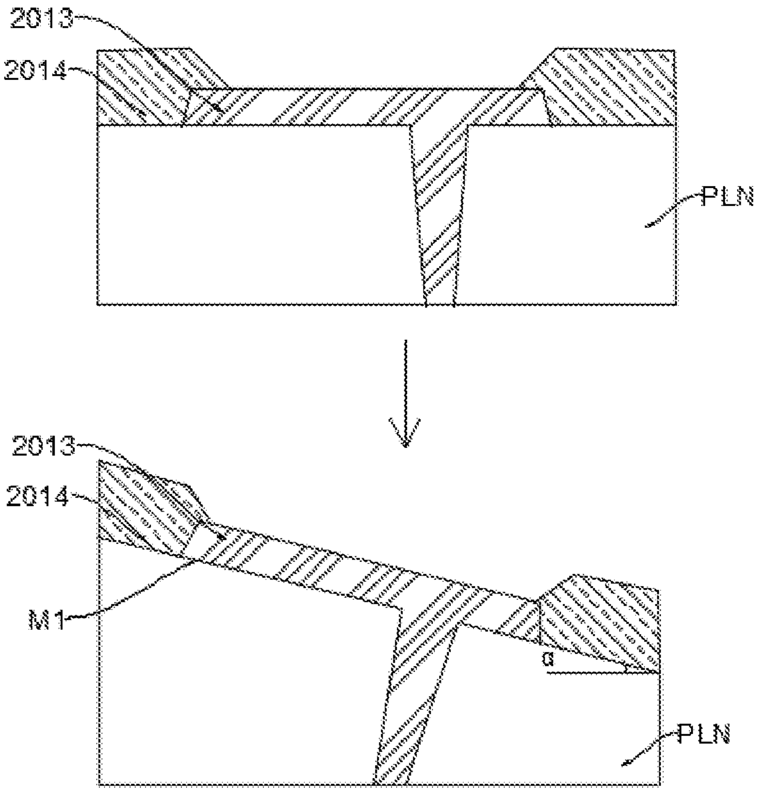
FIG. 10 is a schematic diagram of a structure of adjusting a deflection of a light-emitting unit according to the embodiments of the present application.

The embodiments of the present invention also provide a display panel, as shown in FIGS. 9 and 10, the display panel comprises:

- a light-emitting layer, comprising multiple light-emitting unit groups G201 arranged along a first direction F1, the light-emitting unit group G201 comprising at least one light-emitting unit 201, the multiple light-emitting unit groups G201 comprising one visual center unit group G201C, a rest of the multiple light-emitting unit groups G201 being respectively located on two sides of the visual center unit group G201C;
- an adjustment layer 300, being disposed on one side of a backlight surface of the light-emitting layer, the adjustment layer 300 comprising multiple adjustment unit groups, the adjustment unit groups being disposed corresponding to the light-emitting unit groups G201. A side surface of the adjustment unit group in contact with the light-emitting unit 201 is an inclined surface M1 with an inclination angle $\alpha$, so that a light-emitting surface P1 of the light-emitting unit 201 is deflected toward the visual center unit group G201C. The degrees of the inclination angles $\alpha$ of the adjustment unit groups corresponding to the different light-emitting unit groups G201 are different.

Specifically, in the embodiments, the display panel is a rectangular display panel as an example for description. The display panel comprises a long side (a length direction) and a short side (a width direction).

Specifically, the display panel comprises a center line CL. The center line CL passes through a center of the display panel and is perpendicular to the display panel. The observation point of the human eye may be on the center line CL or not on the center line CL. A second direction F2 is parallel to the center line CL. The first direction F1 and the second direction F2 define a preset included angle.

Specifically, the light-emitting unit group G201 of the display panel vertically corresponding to the observation point of the human eye is the visual center unit group G201C.

Specifically, the visual center unit group G201C comprises multiple visual center units 201C.

It should be noted that the observation point of the user is not necessarily located on a plane passing through the center line CL of the display panel and perpendicular to the display panel. Therefore, the visual center unit group G201C determined according to the user's observation point is not limited to the light-emitting unit group G201 at the center of the display panel. This embodiment is described by taking the visual center unit group G201C as the light-emitting unit group G201 at the center of the display panel as an example.

Specifically, the display panel comprises an array substrate and a light-emitting layer disposed on the array substrate. The array substrate comprises a substrate layer and a control device layer. The control device layer comprises multiple control devices for controlling the light-emitting units 201 to emit light.

Specifically, the light-emitting layer comprises multiple light-emitting unit groups G201 arranged along a first direction F1. The light-emitting unit group G201 comprises at least one light-emitting unit 201. In one specific embodiment, as shown in FIGS. 3 and 8, the light-emitting unit group G201 may comprise multiple columns of light-emitting units 201 arranged along a length direction of the display panel. The number of the light-emitting units 201 in each column is the same. The number of columns of the light-emitting units 201 in the different light-emitting unit groups G201 may be the same or may be different. The number of the light-emitting units 201 in each column in the different light-emitting unit groups G201 is the same. An included angle between the first direction F1 and the second direction F2 may be 90°.

Specifically, as shown in FIG. 10, the light-emitting layer comprises: an anode layer 2013, a pixel definition layer 2014 disposed on the anode layer 2013, and a cathode layer 2011 disposed on the pixel definition layer 2014 (not shown). The pixel definition layer 2014 disposes multiple pixel openings. one of the light-emitting units 201 corresponds to one of the pixel openings. The pixel openings are filled with an organic light-emitting material 2012 (not shown).

Specifically, the adjustment layer 300 may comprise the array substrate, or may be a film layer separately disposed between the array substrate and the light-emitting layer. Specific material and structure are not limited. That is, a structure capable of adjusting an inclination angle of the light-emitting unit 201 of the light-emitting unit groups G201 is within the scope of protection of the present application.

Specifically, the anode layer 2013 of the light-emitting layer is in control connection with the control device on the array substrate.

Specifically, the adjustment layer 300 comprises multiple adjustment unit groups. The adjustment unit group comprises multiple adjustment units. The adjustment unit groups and the light-emitting unit groups G201 correspond to each other. The adjustment units in the adjustment unit group and the light-emitting units 201 in the light-emitting unit group G201 correspond to each other.

Specifically, the anode layer 2013 of the light-emitting layer is disposed on the adjustment layer 300, so that the inclination angle of the light-emitting unit 201 can be adjusted by adjusting the inclination angle of the adjustment unit.

Specifically, as shown in FIG. 9, in a positive direction (+F1) and a negative direction (−F1) of the first direction F1, inclination directions of the light emitting units 201 in the light emitting unit groups G201 located on two sides of the center line CL are opposite.

Specifically, the inclination angles of the inclined surfaces M1 of any two adjacent adjustment units may be same or different.

It can be understood that, when the adjustment layer 300 is disposed on one side of the light-emitting layer close to the substrate, by disposing the different adjustment unit groups to have the inclined surfaces M1 with different inclination angles, making the inclination directions all towards the visual center unit group G201C, and adjusting the specific inclination angle of the light-emitting unit group G201, chromaticity difference between the light-emitting unit groups G201 adjacent to the vision center unit group G201C and the vision center unit group G201C can be reduced. Specifically, an included angle between an emergent light (the emergent light of the light-emitting unit 201 observed by the user) of the light-emitting unit 201 in different light-emitting unit groups G201 and a normal line of the corresponding light-emitting unit 201 is smaller than that before disposing the adjustment layer 300 (ie $\varphi<\theta$) (please compare FIG. 1 and FIG. 9). In other words, the above technical solution can effectively reduce chromaticity difference of an electroluminescent display device due to difference in a viewing angle of the user, further improve display effect of the display panel and enhance user experience.

In one embodiment, in any two of the adjustment unit groups, the inclination angle $\alpha$ of one adjustment unit group close to the vision center unit group G201C is smaller than the inclination angle $\alpha$ of the other adjustment unit group farther from the vision center unit group G201C.

Specifically, the center line CL passes through the visual center unit group G201C.

Specifically, as shown in FIG. 9, the inclination angles of the adjustment unit groups have a gradually increasing trend in an extending direction (a positive direction (+F1) and a negative direction (−F1) of the first direction F1) from the center line CL to the short side of the display panel.

It can be understood that, by disposing the different adjustment unit groups to have different inclination angles, which have a gradually increasing trend in the extending direction (the positive direction (+F1) and the negative direction (−F1) of the first direction F1) from the center line CL to the short side of the display panel, chromaticity difference between any two adjacent light-emitting unit groups G201 in the display panel remains stable to improve display uniformity of the display panel.

In one embodiment, the display panel comprises an array substrate. The adjustment layer 300 comprises the array substrate.

Specifically, the array substrate comprises a substrate layer, a control device layer disposed on the substrate layer, and a passivation layer PLN disposed on one side of the control device layer away from the substrate layer. The different adjustment unit groups have different inclination angles. It can be understood that the substrate layer of the array substrate corresponding to the different adjustment unit groups has different inclination angles. It can also be understood that the control device layer of the array substrate corresponding to the different adjustment unit groups has different inclination angles, or that the passivation layer PLN of the array substrate corresponding to the different adjustment unit groups has different inclination angles.

It can be understood that, the array substrate is used as the adjustment layer 300, by adjusting inclination angles of different areas of the array substrate to adjust inclination angles of the light emitting units 201 in the light emitting unit groups G201, a thickness of the display panel can be effectively reduced, so that the display panel can achieve an effect of reducing chromaticity difference without additionally adding layers, the display panel is lighter and thinner, and a manufacturing process is convenient.

In one embodiment, as shown in FIG. 10, the array substrate comprises a substrate layer (not shown), a control device layer (not shown) disposed on the substrate layer, and a passivation layer PLN disposed on one side of the control device layer away from the substrate layer.

In a direction perpendicular to the light-emitting layer, the thicknesses of the substrate layer and the control device layer corresponding to the different adjustment unit groups are the same, and the passivation layer PLN corresponding to the different adjustment unit groups has multiple passivation unit groups. One side of the different passivation unit groups facing the light emitting unit 201 is an inclined surface M1 and has different inclination angles α.

Specifically, a material of the passivation layer PLN may be silicon nitride.

It can be understood that, the passivation layer PLN on an uppermost layer of the array substrate is disposed with different inclination angles corresponding to the different adjustment unit groups, so that preventing metal traces of the control device layer of the array substrate from breaking due to height difference between layers, which will affect the normal display of the display panel. The passivation layer PLN on the uppermost layer is disposed with the different inclination angles corresponding to the adjustment unit groups, on one hand, it can achieve an effect of isolating the control device and the light-emitting unit 201, and on the other hand, it can also solve a problem of chromaticity difference between the adjacent light-emitting units 201.

In one embodiment, the technical solutions of the above-mentioned display panels can be used in a superimposed manner. For example, the adjustment layer 300 is disposed on one side of a backlight surface of the light-emitting layer, the multiple adjustment unit groups corresponding to the adjustment layer 300 have different thicknesses, and the side of the corresponding adjustment unit groups close to the light-emitting unit groups G201 also has the inclined surface M1. So, the light-emitting unit groups G201 on the light-emitting layer have different heights, and the light-emitting surfaces of the corresponding light-emitting units 201 are deflected toward the visual center unit group G201C. This enables the light-emitting layer adjusted by the adjustment layer 300 to overcome the chromaticity difference caused by difference in a viewing angle of the user.

Figure 11:
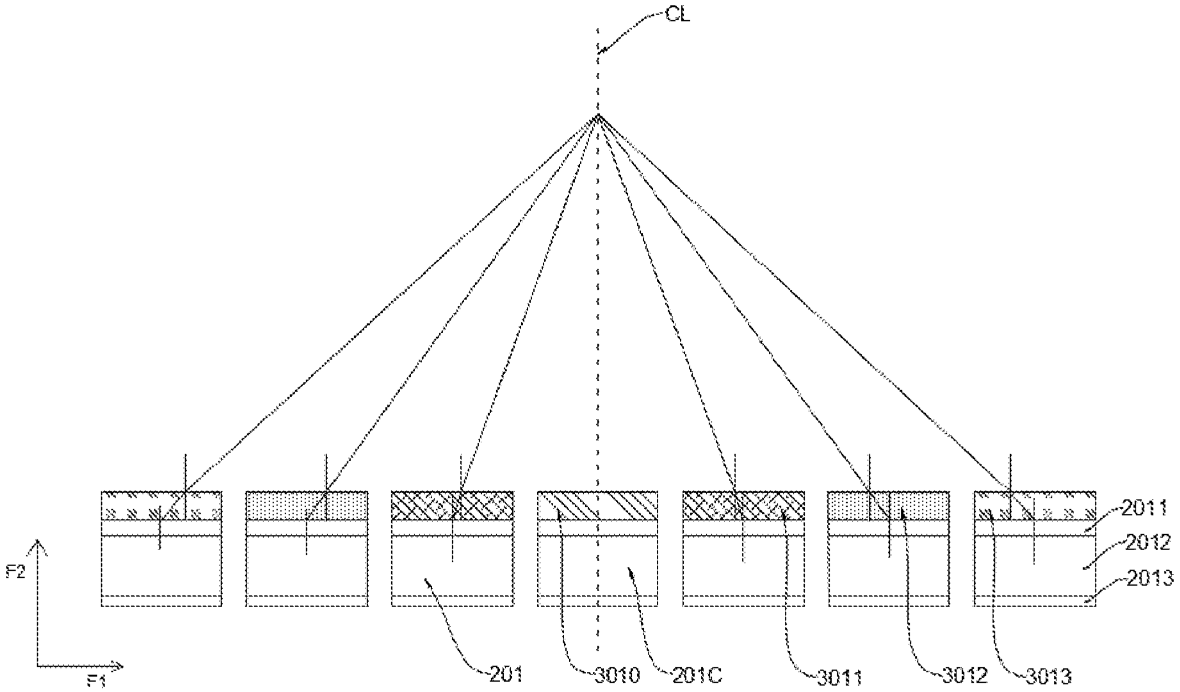
FIG. 11 is a structural schematic diagram of a light-emitting layer of another display panel provided by the embodiments of the present application.

The embodiments of the present invention also provide a display panel, as shown in FIG. 11, the display panel comprises:

- a light-emitting layer, comprising multiple light-emitting unit groups G201 arranged along a first direction F1, the light-emitting unit group G201 comprising at least one light-emitting unit 201, the multiple light-emitting unit groups G201 comprising one visual center unit group G201C, a rest of the multiple light-emitting unit groups G201 being respectively located on two sides of the visual center unit group G201C;
- an adjustment layer 300, being disposed on one side of a light-emitting surface P1 of the light-emitting layer, the adjustment layer 300 comprising multiple adjustment unit groups, the multiple adjustment unit groups comprising one adjustment center unit group corresponding to the visual center unit group G201C.

Wherein, refractive indices of materials of the adjustment unit groups on two sides of the adjustment center unit group are greater than a refractive index of material of the adjustment center unit group.

Specifically, the display panel comprises a center line CL. The center line CL passes through a center of the display panel and is perpendicular to the display panel. The observation point of the human eye may be on the center line CL or not on the center line CL. A second direction F2 is parallel to the center line CL. The first direction F1 and the second direction F2 define a preset included angle. An included angle between the first direction F1 and the second direction F2 may be 90°.

Specifically, the light-emitting layer comprises: an anode layer 2013, a pixel definition layer 2014 disposed on the anode layer 2013, and a cathode layer 2011 disposed on the pixel definition layer 2014. The pixel definition layer 2014 disposes multiple pixel openings. One of the light-emitting units 201 corresponds to one of the pixel openings. The pixel openings are filled with an organic light-emitting material 2012. The adjustment layer 300 is disposed on the cathode layer 2011.

Specifically, the materials of the different adjustment unit groups in the adjustment layer 300 are all different, including but not limited to one or more combinations of magnesium fluoride, silicon dioxide, aluminum oxide, silicon monoxide, titanium dioxide, titanium pentoxide, titanium dioxide, titanium monoxide, hafnium oxide, zirconium oxide, niobium oxide, magnesium oxide, zinc oxide, yttrium oxide, aluminum fluoride and barium fluoride.

It can be understood that, when the adjustment layer 300 is disposed on one side of the light-emitting layer away from the substrate, the adjustment unit groups can be disposed to have different refractive indices for reducing chromaticity difference between the light-emitting unit groups G201 adjacent to the vision center unit group G201C and the vision center unit group G201C. The above technical solution can effectively reduce chromaticity difference of an electroluminescent display device due to difference in a viewing angle of the user, and further improve display effect of the display panel.

In one embodiment, in any two of the adjustment unit groups, the refractive index of the material of one adjustment unit group close to the vision center unit group G201C is smaller than the refractive index of the material of the other adjustment unit group farther from the vision center unit group G201C. Specifically, the center line CL passes through the visual center unit group G201C.

Specifically, taking the embodiment shown in FIG. 11 as an example, the adjustment layer 300 comprises a fourth adjustment unit group, a third adjustment unit group, a second adjustment unit group and a first adjustment unit group. Wherein, a refractive index of a material of a fourth adjustment unit 3010 in the fourth adjustment unit group is n4; a refractive index of a material of a third adjustment unit 3011 in the third adjustment unit group is n3; a refractive index of a material of a second adjustment unit 3012 in the second adjustment unit group is n2; and a refractive index of a material of a first adjustment unit 3013 in the first adjustment unit group is n1. A corresponding condition is $n4<n3<n2<n1$.

It can be understood that, by disposing the materials of the multiple adjustment unit groups to have different refractive indices, the refractive indices of the materials of the adjustment unit groups gradually increase in an extending direction (a positive direction (+F1) and a negative direction (−F1) of the first direction F1) from the center line CL to a short side of the display panel, so that there is a small chromaticity difference between any two adjacent light-emitting units 201 in the display panel, to further improve display uniformity of the display panel.

In summary, the present application disposes the adjustment layer 300 on one side of the light-emitting layer. The adjustment layer 300 may be disposed on the side of the light-emitting layer away from the substrate, or may be disposed on the side close to the substrate. When the adjustment layer 300 is disposed on the side of the light-emitting layer close to the substrate, the adjustment unit groups can be disposed to have the different thicknesses or the adjustment unit groups can be disposed to have the inclined surface M1, the inclination angles α of the inclined surfaces M1 of the different adjustment unit groups are different. When the adjustment layer 300 is disposed on the side of the light-emitting layer away from the substrate, the adjustment unit groups can be disposed to have the different refractive indices. A final effect is to make the included angle between the emergent light of the light-emitting unit 201 in the different light-emitting unit groups G201 and the normal line of the corresponding light-emitting unit 201 after disposing the adjustment layer 300 is smaller than that before disposing the adjustment layer 300. The above technical solution can effectively reduce chromaticity difference of an electroluminescent display device due to difference in a viewing angle of the user, and further improve display effect of the display panel.

It can be understood that, for those of ordinary skill in the art, equivalent replacements or changes can be made according to the technical solutions of the present application and the inventive concept thereof, and all these changes or replacements should belong to the protection scope of the appended claims of the present application.

What is claimed is:

1. A display panel, comprising:

a light-emitting layer, comprising multiple light-emitting unit groups arranged along a first direction, the light-emitting unit group comprising at least one light-emitting unit, the multiple light-emitting unit groups comprising one visual center unit group, a rest of the multiple light-emitting unit groups being respectively located on two sides of the visual center unit group;

an adjustment layer, being disposed on one side of a backlight surface of the light-emitting layer, the adjustment layer comprising multiple adjustment unit groups, the adjustment unit groups being disposed corresponding to the light-emitting unit groups;

wherein, in a direction perpendicular to the light-emitting layer, the multiple adjustment unit groups have multiple thicknesses, and heights of the light-emitting unit groups located on the two sides of the visual center unit group are smaller than a height of the visual center unit group.

2. The display panel according to claim 1, wherein in any two of the adjustment unit groups, a thickness of one adjustment unit group close to the vision center unit group is greater than a thickness of the other adjustment unit group farther from the vision center unit group.

3. The display panel according to claim 2, wherein the display panel comprises an array substrate, the adjustment layer comprises the array substrate.

4. The display panel according to claim 1, wherein the display panel comprises an array substrate, the adjustment layer comprises the array substrate.

5. The display panel according to claim 3, wherein the array substrate comprises a substrate layer, a control device layer disposed on the substrate layer, and a passivation layer disposed on one side of the control device layer away from the substrate layer;

in a direction perpendicular to the light-emitting layer, thicknesses of the substrate layer and the control device layer corresponding to the different adjustment unit groups are same, and the passivation layer corresponding to the different adjustment unit groups has different thicknesses.

6. The display panel according to claim 5, wherein a material of the passivation layer comprises silicon nitride.

7. The display panel according to claim 1, wherein the light-emitting layer comprises: an anode layer, a pixel definition layer disposed on the anode layer, and a cathode layer disposed on the pixel definition layer.

8. The display panel according to claim 7, wherein the pixel definition layer disposes multiple pixel openings, one of the light-emitting units corresponds to one of the pixel openings, and the pixel openings are filled with an organic light-emitting material.

9. The display panel according to claim 8, wherein the anode layer of the light-emitting layer is disposed on the adjustment layer.

10. A display panel, comprising:

a light-emitting layer, comprising multiple light-emitting unit groups arranged along a first direction, the light-emitting unit group comprising at least one light-emitting unit, the multiple light-emitting unit groups comprising one visual center unit group, a rest of the multiple light-emitting unit groups being respectively located on two sides of the visual center unit group;

an adjustment layer, being disposed on one side of a light-emitting surface of the light-emitting layer, the adjustment layer comprising multiple adjustment unit groups, the multiple adjustment unit groups comprising one adjustment center unit group corresponding to the visual center unit group;

wherein, refractive indices of materials of the adjustment unit groups on two sides of the adjustment center unit group are greater than a refractive index of a material of the adjustment center unit group.

11. The display panel according to claim 10, wherein in any two of the adjustment unit groups, the refractive index of the material of one adjustment unit group close to the vision center unit group is smaller than the refractive index of the material of the other adjustment unit group farther from the vision center unit group.

12. The display panel according to claim 10, wherein the materials of the different adjustment unit groups in the adjustment layer are different, and the materials of the adjustment unit groups comprise one or more combinations of magnesium fluoride, silicon dioxide, aluminum oxide, silicon monoxide, titanium dioxide, titanium pentoxide, titanium dioxide, titanium monoxide, hafnium oxide, zirconium oxide, niobium oxide, magnesium oxide, zinc oxide, yttrium oxide, aluminum fluoride and barium fluoride.

13. The display panel according to claim 10, wherein the light-emitting layer comprises: an anode layer, a pixel definition layer disposed on the anode layer, and a cathode layer disposed on the pixel definition layer.

14. The display panel according to claim 13, wherein the pixel definition layer disposes multiple pixel openings, one of the light-emitting units corresponds to one of the pixel openings, the pixel openings are filled with an organic light-emitting material, and the cathode layer covers the pixel openings.

15. The display panel according to claim 14, wherein the adjustment layer is disposed above the cathode layer of the light-emitting layer.

* * * * *